United States Patent … US 9,530,520 B2
Xu … Dec. 27, 2016

(54) SHIFT REGISTER UNIT, GOA CIRCUIT, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Xiangyang Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 96 days.

(21) Appl. No.: 14/432,010

(22) PCT Filed: Jun. 30, 2014

(86) PCT No.: PCT/CN2014/081241
§ 371 (c)(1),
(2) Date: Mar. 27, 2015

(87) PCT Pub. No.: WO2015/058553
PCT Pub. Date: Apr. 30, 2015

(65) Prior Publication Data
US 2016/0027526 A1 Jan. 28, 2016

(30) Foreign Application Priority Data
Oct. 23, 2013 (CN) .......................... 2013 1 0503022

(51) Int. Cl.
*G09G 3/20* (2006.01)
*G11C 19/28* (2006.01)

(52) U.S. Cl.
CPC ............. *G11C 19/28* (2013.01); *G09G 3/2096* (2013.01); *G09G 2310/0286* (2013.01)

(58) Field of Classification Search
CPC ........... G11C 19/00; G11C 19/28; G09G 3/20; G09G 3/36; G09G 3/2096; G09G 2310/0286
See application file for complete search history.

(56) References Cited

U.S. PATENT DOCUMENTS

2005/0275614 A1   12/2005   Kim et al.
2006/0262055 A1   11/2006   Takahara
(Continued)

FOREIGN PATENT DOCUMENTS

CN        1707589 A    12/2005
CN      102831861 A    12/2012
(Continued)

OTHER PUBLICATIONS

International Search Report and Written Opinion both dated Oct. 9, 2014; PCT/CN2014/081241.
(Continued)

*Primary Examiner* — Lun-Yi Lao
*Assistant Examiner* — Johny Lau
(74) *Attorney, Agent, or Firm* — Ladas & Parry LLP (57) ABSTRACT

A shift register unit, a GOA circuit, an array substrate and a display device are provided. The shift register unit comprises an input module, a charging module, a reset module, a first switch module T1 and a second switch module T2. A output terminal of the input module is connected to gate line Gi through T1 and connected to gate line Gi+3 through T2, gates of T1 and T2 are connected to a first clock signal line and a second clock signal line having a phase difference of half of a cycle. The gate lines Gi−1 and Gi+2 are connected to the input terminal of the input module through the charging module; the gate lines Gi+1 and Gi+4 are connected to the input terminal and the output terminal of the input module through the reset module. One shift register (Continued)

unit is shared by two gate lines, which reduces the area occupied by the GOA circuit on the array substrate, and satisfies the requirement of narrow frames of the array substrate.

16 Claims, 4 Drawing Sheets

(56) References Cited

U.S. PATENT DOCUMENTS

2012/0044133 A1   2/2012   Nakamizo
2015/0077319 A1   3/2015   Yao et al.

FOREIGN PATENT DOCUMENTS

CN   103345941 A   10/2013
CN   103500551 A    1/2014

OTHER PUBLICATIONS

International Search Report Appln. No. PCT/CN2014/081241; Dated Oct. 9, 2014.
Written Opinion of the International Searching Authority Appln. No. PCT/CN2014/081241; Dated Oct. 9, 2014.

SHIFT REGISTER UNIT, GOA CIRCUIT, ARRAY SUBSTRATE AND DISPLAY DEVICE

CROSS-REFERENCE TO RELATED APPLICATIONS

This application is a national stage entry of PCT Application No. PCT/CN2014/081241, entitled "shift register unit, GOA circuit, array substrate and display device" and filed on Jun. 30, 2014, which itself claims priority to a Chinese Patent Application No. 201310503022.5, filed on Oct. 23, 2013, both of which are incorporated by reference in their entireties.

TECHNICAL FIELD OF THE DISCLOSURE

The present disclosure relates to the field of display technique, and in particular to a shift register unit, GOA circuit, array substrate and display device.

BACKGROUND

With the continuous progress of display technique, displays driven by thin film transistors such as Liquid Crystal Display (TFT-LCD for short), Organic Light-Emitting Diode (OLED for short) display or the like take the dominant position in the field of flat panel displays. Nowadays, more and more displays employ the technique of making Gate Driver On Array (GOA for short) on the array substrate, so as to reduce the frame width of the array substrate of the display.

The existing GOA circuit is mainly composed of a plurality of shift register units, and each of the plurality of shift register units corresponds to a gate line and charges a capacitor in this shift register unit using a high level signal output from the previous gate line, so as to make the present gate line output the high level signal and implement the reset by using the high level signal output from the next gate line. However, the existing GOA circuit still occupies a large area on the array substrate and thus it is difficult to satisfy the requirement of narrow frames of the substrate array.

SUMMARY

According to an aspect of the present disclosure, there is provided an shift register unit, comprising an input module, a charging module, a reset module, a first switch module and a second switch module.

A output terminal of the input module is connected to an $i^{th}$ gate line through the first switch module and connected to a $(i+3)^{th}$ gate line through the second switch module, a control terminal of the first switch module is connected to a first clock signal line and a control terminal of the second switch module is connected to a second clock signal line, and a phase difference between clock signals output from the first clock signal line and the second clock signal line is half of a cycle.

A $(i-1)^{th}$ gate line and a $(i+2)^{th}$ gate line are connected to an input terminal of the input module through the charging module; a $(i+1)^{th}$ gate line and a $(i+4)^{th}$ gate line are connected to the input terminal and the output terminal of the input module through the reset module, wherein i is a natural number and i≥2.

Optionally, the first switch module is a first switch transistor and the control terminal of the first switch module is gate of the first switch transistor; the second switch module is a second switch transistor and the control terminal of the second switch module is gate of the second switch transistor.

Optionally, the input module comprises a capacitor and an output switch transistor, two terminals of the capacitor are connected to gate and drain of the output switch transistor, respectively, and source of the output switch transistor is connected to a high level signal line; the gate of the output switch transistor is the input terminal of the input module and the drain of the output switch transistor is the output terminal of the input module.

Optionally, the charging module comprises a third switch transistor, the $(i-1)^{th}$ gate line and the $(i+2)^{th}$ gate line are connected to gate and source of the third switch transistor, respectively, and drain of the third switch transistor is connected to the input terminal of the input module.

Furthermore, the $(i-1)^{th}$ gate line is connected to the gate and source of the third switch transistor through a first anti-interference transistor, the $(i-1)^{th}$ gate line is connected to source and gate of the first anti-interference transistor, and the gate and source of the third switch transistor are connected to drain of the first anti-interference transistor.

The $(i+2)^{th}$ gate line is connected to the gate and source of the third switch transistor through a second anti-interference transistor, the $(i+2)^{th}$ gate line is connected to source and gate of the second anti-interference transistor, and the gate and source of the third switch transistor are connected to drain of the second anti-interference transistor.

Optionally, the reset module comprises a fourth switch transistor and a fifth switch transistor, the $(i+1)^{th}$ gate line and the $(i+4)^{th}$ gate line are connected to gates of the fourth and the fifth switch transistors, respectively, source of the fourth switch transistor is connected to the input terminal of the input module, source of the fifth switch transistor is connected to the output terminal of the input module, and drains of the fourth and the fifth switch transistors are connected to a low level signal line.

Furthermore, the reset module further comprises a sixth switch transistor and a seventh switch transistor, the $(i+1)^{th}$ gate line and the $(i+4)^{th}$ gate line are connected to gates of the sixth and seventh switch transistors, source of the sixth switch transistor is connected to the $i^{th}$ gate line, source of the seventh switch transistor is connected to the $(i+3)^{th}$ gate line, and drains of the sixth and seventh switch transistors are connected to the low level signal line.

Furthermore, the $(i+1)^{th}$ gate line is connected to the gates of the fourth and the fifth switch transistors through a third anti-interference transistor, the $(i+1)^{th}$ gate line is connected to source and gate of the third anti-interference transistor, and the gates of the fourth and the fifth switch transistors are connected to drain of the third anti-interference transistor.

The $(i+4)^{th}$ gate line is connected to the gates of the fourth and the fifth switch transistors through a fourth anti-interference transistor, the $(i+4)^{th}$ gate line is connected to source and gate of the fourth anti-interference transistor, and the gates of the fourth and the fifth switch transistors are connected to drain of the fourth anti-interference transistor.

There is also provided in the present disclosure a GOA circuit comprising n gate lines, six clock signal lines outputting high level pulse signals circularly, and several shift register units as described above.

The several shift register units are divided into M groups and each of the groups contains three shift register units, and with respect to the $m^{th}$ group of the shift register units:

the control terminal of the first switch module in a shift register unit of a first stage is connected to a first clock signal line;

the control terminal of the first switch module in a shift register unit of a second stage is connected to a second clock signal line;

the control terminal of the first switch module in a shift register unit of a third stage is connected to a third clock signal line;

the control terminal of the second switch module in the shift register unit of the first stage is connected to a fourth clock signal line;

the control terminal of the second switch module in the shift register unit of the second stage is connected to a fifth clock signal line;

the control terminal of the second switch module in the shift register unit of the third stage is connected to a sixth clock signal line;

the $i^{th}$ gate line is connected to the output terminal of the first switch module in the shift register unit of the first stage and the charging module in the shift register unit of the second stage;

the $(i+1)^{th}$ gate line is connected to the output terminal of the first switch module in the shift register unit of the second stage, the charging module in the shift register unit of the third stage, and the reset module in the shift register unit of the first stage;

the $(i+2)^{th}$ gate line is connected to the output terminal of the first switch module in the shift register unit of the third stage, the charging module in the shift register unit of the first stage, and the reset module in the shift register unit of the second stage;

the $(i+3)^{th}$ gate line is connected to the output terminal of the second switch module in the shift register unit of the first stage, the charging module in the shift register unit of the second stage and the reset module in the shift register unit of the third stage;

the $(i+4)^{th}$ gate line is connected to the output terminal of the second switch module in the shift register unit of the second stage, the charging module in the shift register unit of the third stage, and the reset module in the shift register unit of the first stage;

the $(i+5)^{th}$ gate line is connected to the output terminal of the second switch module in the shift register unit of the third stag and the reset module in the shift register unit of the second stage;

wherein n, i and m are all natural numbers, n≥6, 1≤m≤M, and i=6m−5.

Furthermore, when m>1, the $i^{th}$ gate line is further connected to the reset module in the shift register unit of the third stage in the $(m-1)^{th}$ group of the shift register units.

When m<M, the $(i+5)^{th}$ is further connected to the charging module in the shift register unit of the first stage in the $(m+1)^{th}$ group of the shift register units.

There is also provided in the present disclosure an array substrate comprising a GOA area and a display area, wherein the GOA circuit as described above is set in the GOA area.

There is also provided in the present disclosure a display device comprising the array substrate as described above.

According to the technical solution of the present disclosure as described above, when the $(i-1)^{th}$ gate line outputs a high level signal, the charging module in the shift register unit can charge the input module. During the next time period, the output terminal of the input module will output a high level signal. When setting the clock signal line, the clock signal line connected with the control terminal of the first switch module can be set to output a high level pulse signal during this time period, and thus the first switch module is ON during this time period so that the $i^{th}$ gate line can output the high level signal from the input module through the first switch module. During the next time period, the reset module in the shift register unit resets the input module by using the high level signal output from the $(i+1)^{th}$ gate line.

During the next time period, the $(i+2)^{th}$ gate line outputs the high level signal and the charging module in the shift register unit can charge the input module. During the next time period, the output terminal of the input module will output the high level signal. At that time, the clock signal line connected with the control terminal of the second switch module just outputs the high level pulse signal, and thus the second switch module will be ON during this time period, the $(i+3)^{th}$ gate line can output the high level signal through the second switch module. During the next time period, the reset module in the shift register unit resets the input module by using the high level signal output from the $(i+4)^{th}$ gate line.

Therefore, in the technical solution provided in the present disclosure, it is possible to share one shift register unit by the $i^{th}$ and the $(i+3)^{th}$ gate lines so that the number of the shift register units can be reduce by half and the area occupied by the GOA circuit on the array substrate can be reduced, which satisfies the requirement of narrow frames of the substrate array.

BRIEF DESCRIPTION OF THE DRAWINGS

The figures with reference to which embodiments of the present disclosure will be described are briefly described below so as to explain the technical solutions of the embodiments clearly.

DETAILED DESCRIPTION

A clear and complete description of the technical solutions of the embodiments of the present disclosure will be provided with reference to the figures in the embodiments.

First Embodiment

Figure 1:
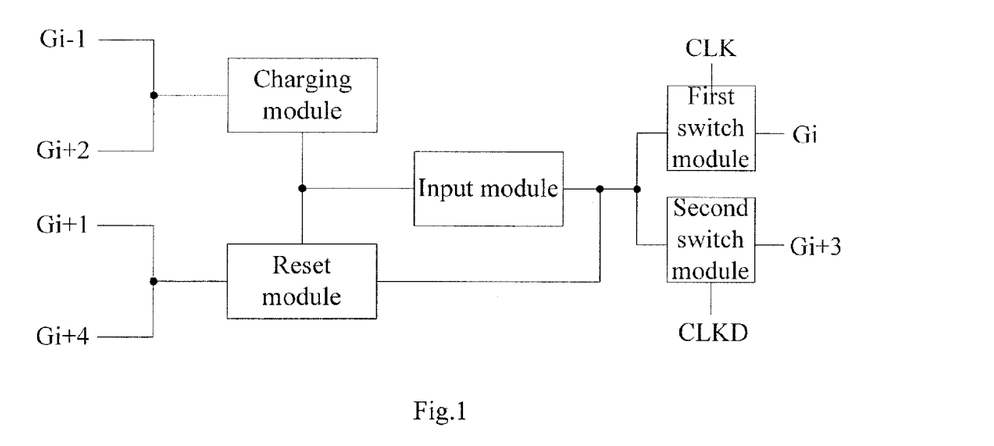
FIG. 1 is a schematic diagram of a shift register unit provided in a first embodiment of the present disclosure.

As shown in FIG. 1, the shift register unit includes an input module, a charging module, a reset module, a first switch module and a second switch module.

Figure 2:
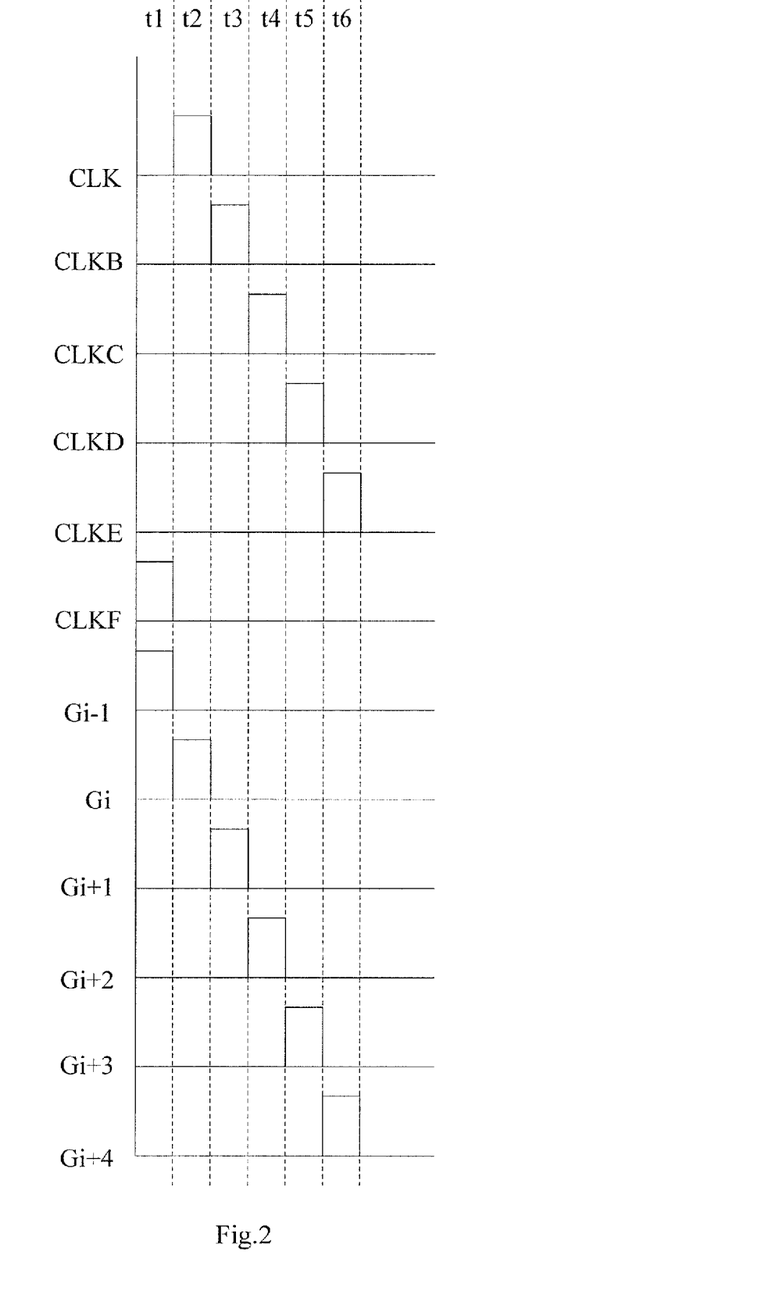
FIG. 2 is a signal timing chart of the shift register unit provided in the embodiment of the present disclosure.

An output terminal of the input module is connected to the $i^{th}$ gate line Gi through the first switch module and connected to the $(i+3)^{th}$ gate line Gi+3 through the second switch module, wherein i is a natural number and i≥2. A control terminal of the first switch module is connected to a first clock signal line and a control terminal of the second switch module is connected to a second clock signal line. The phase difference between the first clock signal line and the second clock signal line is half of a cycle. With reference to FIG. 2, in the present embodiment, the first clock signal line CLK is connected with the control terminal of the first switch module and the second clock signal line CLKD is connected with the control terminal of the second switch module.

The (i−1)$^{th}$ gate line Gi−1 and the (i+2)$^{th}$ gate line Gi+2 are connected to the input terminal of the input module through the charging module, the (i+1)$^{th}$ gate line Gi+1 and the (i+4)$^{th}$ gate line are connected to the input terminal and the output terminal of the input module through the reset module.

Optionally, the first switch module is a first switch transistor T1. The control terminal of the first switch module is gate of T1, the input terminal of the first switch module is source of T1 and is connected to the output terminal of the input module, and the output terminal of the first switch module is drain of T1 and is connected to Gi. The second switch module is a second switch transistor T2. The control terminal of the second switch module is gate of T2, the input terminal of the second switch module is source of T2 and is connected to the output terminal of the input module, and the output terminal of the second switch module is drain of T2 and is connected to Gi+3.

As shown in FIGS. 1 and 2, in the shift register unit of the present embodiment, Gi−1 outputs the high level signal during the time period of t1, and the charging module can charge the input module. During the time period of t2, the high level signal is output from the output terminal of the input module. When setting CLK and CLKD, the CLK connected with the gate of T1 can be set to output high level pulse signal during the time period of t2, and thus T1 is turned on during this time period so that Gi can output the high level signal from the input module through T1. During the time period of t3, the reset module in the shift register unit resets the input module by using the high level signal output from Gi+1.

During the time period of t4, Gi+2 outputs the high level signal and the charging module in the shift register unit can charge the input module. During the time period of t5, the output terminal of the input module outputs the high level signal. At that time, the CLKD connected with the gate of T2 output the pulse signal of high level, and thus T2 will be turned on during this time period so that Gi+3 can output the high level signal from the input module through T2. During the time period of t6, the reset module in the shift register unit resets the input module by using the high level signal output from Gi+4.

Therefore, in the present embodiment, Gi and Gi+3 gate lines share one shift register unit, so that the number of the shift register units can be reduce by half and the area occupied by the GOA circuit on the array substrate can be reduced, which satisfies the requirement of narrow frames of the substrate array.

Second Embodiment

Figure 3:
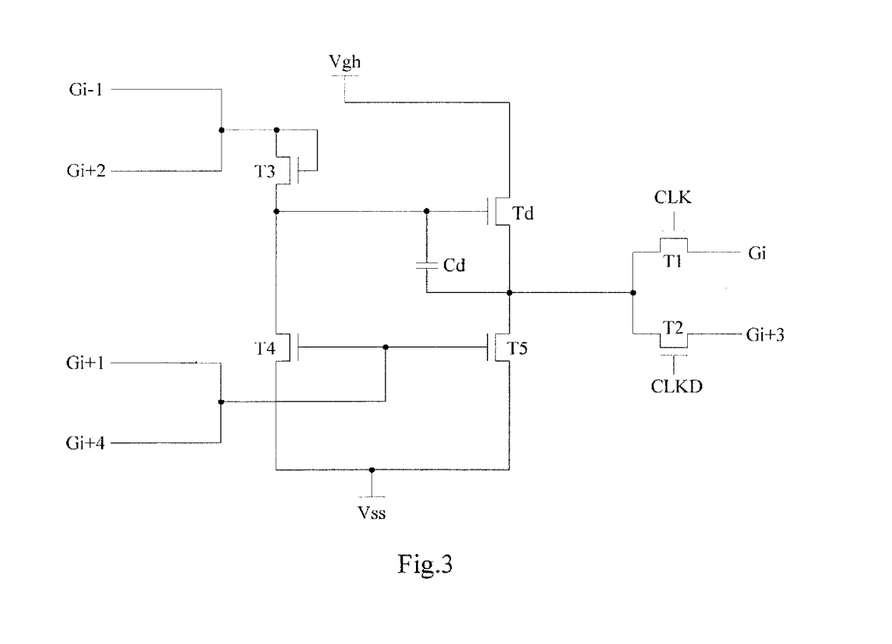
FIG. 3 is a schematic diagram of a shift register unit provided in a second embodiment of the present disclosure.

The present embodiment is a specific implementation illustratively showing the shift register unit according to the first embodiment. As shown in FIG. 3, in the present embodiment, the input module includes a capacitor Cd and an output switch transistor Td. The two terminals of Cd are connected to the gate and drain of Td, respectively. The gate of Td is connected to a high level signal line Vgh. The gate of Td (the first terminal of Cd) is the input terminal of the input module, and the drain of Td (the second terminal of Cd) is the output terminal of the input module. In the present embodiment, as an example, Thin Film Transistor (TFT for short) can be used for all of the switch transistors.

As shown in FIG. 3, optionally, the charging module includes a third switch transistor T3. Gi−1 and Gi+2 are connected to the gate and source of T3, and the drain of T3 is connected to the input terminal of the input module, i.e., the gate of Td (the first terminal of Cd).

When Gi−1 or Gi+2 outputs the high level signal, T3 turns on, and the high level signal on Gi−1 or Gi+2 can charge Cd through T3. In addition, T3 also has a function of preventing interfere, that is, when no signal is output from Gi−1 and Gi+2, T3 turns off to prevent Gi−1 or Gi+2 from affected by the voltage on Cd.

As shown in FIG. 3, optionally, the reset module includes a fourth switch transistor T4 and a fifth switch transistor T5. Gi+1 and Gi+4 are connected to gates of T4 and T5. The source of T4 is connected to the input terminal of the input module, i.e. the gate of Td (the first terminal of Cd), and the source of T5 is connected to the output terminal of the input module, i.e., the second terminal of Cd. The drains of T4 and T5 are connected to a low level signal line Vss.

When Gi+1 or Gi+4 outputs the high level signal, T4 and T5 are turned on, causing the first and second terminals of Cd to be conducted to Vss through T4 and T5, thereby clearing the voltages on the first and second terminals of Cd to reset Cd.

Figure 4:
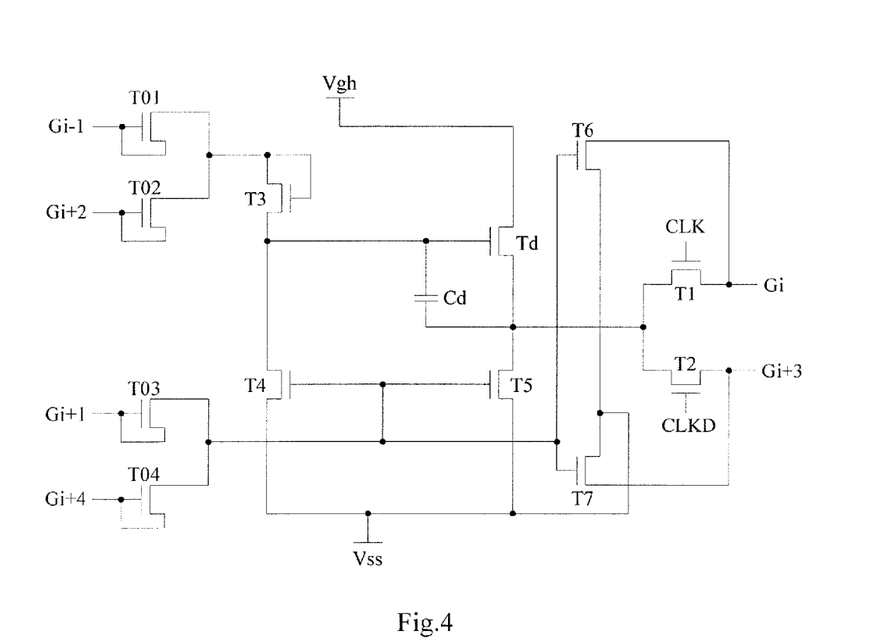
FIG. 4 is another schematic diagram of the shift register unit provided in the second embodiment of the present disclosure.

Furthermore, optionally, as shown in FIG. 4, the reset module can also include a sixth switch transistor T6 and a seventh switch transistor T7. Gi+1 and Gi+4 are connected to gates of T6 and T7. The source of T6 is connected to Gi, and the source of T7 is connected to Gi+3. The drains of T6 and T7 are connected to Vss. In this way, when Gi+1 or Gi+4 outputs the high level signal, T6 and T7 are also turned on, causing Gi and Gi+3 to be conducted to Vss through T6 and T7, thereby clearing the electrical signals on Gi and Gi+3 to further reset Gi and Gi+3.

Furthermore, optionally, Gi−1 is connected to the gate and source of T3 through a first anti-interference transistor T01. In specific, Gi−1 is connected to the source and gate of T01, and the gate and source of T3 are connected to the drain of T01. Gi+2 is connected to the gate and source of T3 through a second anti-interference transistor T02. In specific, Gi+2 is connected to the source and gate of T02, and the gate and source of T3 are connected to the drain of T02. The functions of T01 and T02 are similar to that of T3. When no signal is output from Gi−1 (or Gi+2), T01 (T02) connected to Gi−1 (or Gi+2) will be turned off, thereby preventing the influence on one of Gi−1 and Gi+2 by the high level signal output by the other one of Gi−1 and Gi+2.

In the same way, Gi+1 is connected to the gates of T4 and T5 through T03. In specific, Gi+1 is connected to the source and gate of T03, and the gates of T4 and T5 are connected to the drain of T03. Gi+4 is connected to the gates of T4 and T5 through T04. In specific, Gi+4 is connected to the source and gate of T04, and the gates of T4 and T5 are connected to the drain of T04 so as to prevent the interference between Gi+1 and Gi+4.

As shown in FIGS. 2 and 4, in the shift register unit provided in the present embodiment, during the time period of t1, Gi−1 outputs a high level signal, and the high level signal output from Gi−1 is input to the charging module through T01. T3 in the charging module turns on and the high level signal on Gi−1 charges Cd through T3. During the time period of t2, the charged Cd causes the gate of Td to be at high level so as to turn on Td, and the high level signal on Vgh will be transmitted from the source of Td to the drain of Td. Also, CLK, which is connected to the gate of T1, outputs a pulse signal of high level during the time period of t2, and thus T1 turns on during the time period of t2. Accordingly, Gi can be conducted to the drain of Td through T1 and outputs a high level signal. At the same time, the high level signal output from Gi charges the capacitor in the shift register unit of the next stage. During the time period of t3, Gi+1 is driven by the shift register unit of the next stage, and outputs a high level signal. At the same time, the high level signal output from Gi+1 is input to the reset module in the shift register unit of the current stage through T03, thereby turning on T4, T5, T6 and T7 in the shift register unit of the current stage. The first and second terminals of Cd are conducted to Vss through T4 and T5, respectively, so that the voltage on the first and second terminals of Cd is cleared and Cd is reset. At the same time, Gi is conducted to Vss through T6, thereby clearing the electrical signal on Gi to reset Gi.

During the time period of t4, Gi+2 is driven by the shift register unit of a stage next to that next stage, and outputs a high level signal. At the same time, the high level signal output from Gi+2 is input to the charging module in the shift register unit of the current stage through T02, thereby turning on T3 in the shift register unit of the current stage, and the high level signal on Gi+2 charges Cd through T3. During the time period of t5, the charged Cd causes the gate of Td to be at high level so as to turn on Td, and the high level signal on Vgh is transmitted to the drain of Td. Also, during the time period of t5, CLKD, which is connected to the gate of T2, outputs a pulse signal of high level, and thus T2 turns on during the time period of t5. Accordingly, Gi+3 can be conducted to the drain of Td through T2 and outputs a high level signal. At the same time, the high level signal output from Gi+3 charges the capacitor in the shift register unit of the next stage. During the time period of t6, Gi+4 is driven by the shift register unit of the next stage, and outputs a high level signal. At the same time, the high level signal output from Gi+4 is input to the reset module in the shift register unit of the current stage through T04, thereby turning on T4, T5, T6 and T7 in the shift register unit of the current stage. The first and second terminals of Cd are conducted to Vss through T4 and T5, respectively, so that the voltage on the first and second terminals of Cd is cleared and Cd is reset. At the same time, Gi+3 is conducted to Vss through T7, thereby clearing the electrical signal on Gi+3 to reset Gi+3.

Therefore, in the present embodiment, one shift register unit is shared by Gi and Gi+3 so that the number of the shift register units can be reduce by half and the area occupied by the GOA circuit on the array substrate can be reduced, which satisfies the requirement of narrow frames of the substrate array.

Third Embodiment

The present embodiment provide a GOA circuit including n gate lines, six clock signal lines outputting high level pulse signals circularly, and several shift register units provided in the first and second embodiments. The several shift register units are divided into M groups and each of the groups includes three shift register units. Any one of the M groups of the shift register units (for example, the $m^{th}$ group) is explained below with reference to FIG. 5.

Figure 5:
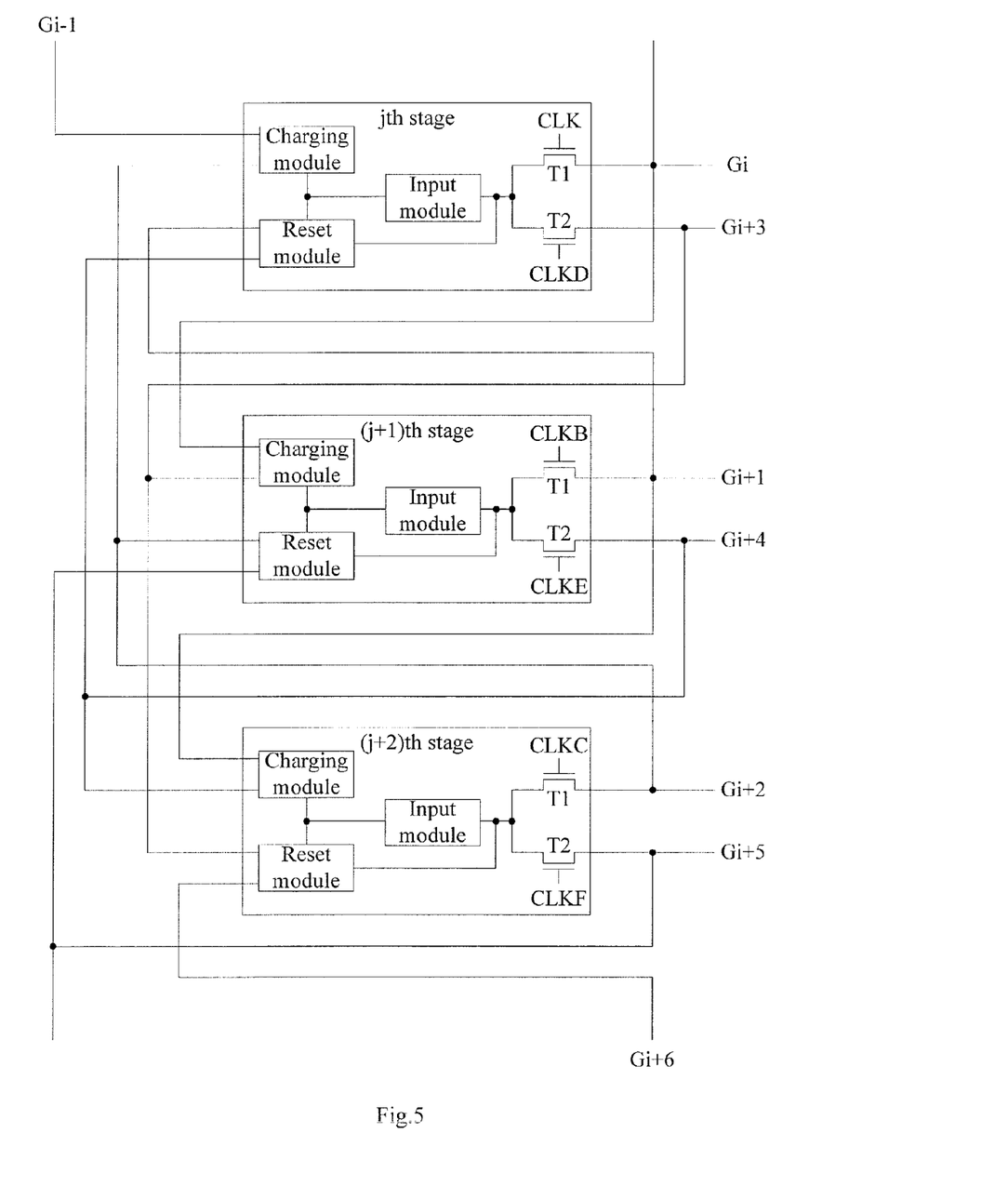
FIG. 5 is a schematic diagram of part of GOA circuit provided in a third embodiment 2 of the present disclosure.

As shown in FIG. 5, the gate of T1 in the shift register unit of the $j^{th}$ stage (that is, the first shift register unit in the $m^{th}$ group) is connected to the clock signal line CLK, the gate of T1 in the shift register unit of the $(j+1)^{th}$ stage (that is, the second shift register unit in the $m^{th}$ group) is connected to the clock signal line CLKB, and the gate of T1 in the shift register unit of the $(j+2)^{th}$ stage (that is, the third shift register unit in the $m^{th}$ group) is connected to the clock signal line CLKC. The gate of T2 in the shift register unit of the $j^{th}$ stage is connected to the clock signal line CLKD, the gate of T2 in the shift register unit of the $(j+1)^{th}$ stage is connected to the clock signal line CLKE, and the gate of T2 in the shift register unit of the $(j+2)^{th}$ stage is connected to the clock signal line CLKF.

Gate line Gi is connected to the drain of T1 in the shift register unit of the $j^{th}$ stage and the charging module in the shift register unit of the next stage (that is, the shift register unit of the $(j+1)^{th}$ stage). In addition, if the shift register unit of the $j^{th}$ stage is not the shift register unit of the first stage, that is, if j>1, then Gi is also connected to the reset module in the shift register unit of the previous stage (that is, the shift register unit of the $(j-1)^{th}$ stage), and Gi−1 is connected to the charging module in the shift register unit of the $j^{th}$ stage.

Gate line Gi+1 is connected to the drain of T1 in the shift register unit of the $(j+1)^{th}$ stage, the charging module in the shift register unit of the $(j+2)^{th}$ stage, and the reset module in the shift register unit of the $j^{th}$ stage.

Gate line Gi+2 is connected to the drain of T1 in the shift register unit of the $(j+2)^{th}$ stage, the charging module in the shift register unit of the $j^{th}$ stage), and the reset module in the shift register unit of the $(j+1)^{th}$ stage.

Gate line Gi+3 is connected to the drain of T2 in the shift register unit of the $j^{th}$ stage, the charging module in the shift register unit of the $(j+1)^{th}$ stage, and the reset module in the shift register unit of the $(j+2)^{th}$ stage.

Gate line Gi+4 is connected to the drain of T2 in the shift register unit of the $(j+1)^{th}$ stage, the charging module in the shift register unit of the $(j+2)^{th}$ stage, and the reset module in the shift register unit of the $j^{th}$ stage.

Gate line Gi+5 is connected to the drain of T2 in the shift register unit of the $(j+2)^{th}$ stage and the reset module in the shift register unit of the $(j+1)^{th}$ stage. In addition, if Gi+5 is not the last gate line and the shift register unit of the $(j+2)^{th}$ stage is not the shift register unit of the last stage, then gate line Gi+5 is also connected to the charging module in the shift register unit of the $(j+3)^{th}$ stage, and gate line Gi+6 is also connected to the reset module in the shift register unit of the $(j+2)^{th}$ stage.

The above n, i and m are all natural numbers, wherein n≥6, 1≤m≤M, i=6m−5.

As can be seem in combination with FIG. 2, in the GOA circuit provided in the present embodiment, during the time period of t1, the high level signal output from Gi−1 charges the first shift register unit of the present group (the $m^{th}$ group).

During the time period of t2, Gi outputs the high level signal through the first shift register unit and charges the second shift register unit of the present group at the same time.

During the time period of t3, Gi+1 outputs the high level signal through the second shift register unit, and charges the third shift register unit and resets the first shift register unit at the same time.

During the time period of t4, Gi+2 outputs the high level signal through the third shift register unit, and charges the first shift register unit and resets the second shift register unit at the same time.

During the time period of t5, Gi+3 outputs the high level signal through the first shift register unit, and charges the second shift register unit and resets the third shift register unit at the same time.

During the time period of t6, Gi+4 outputs the high level signal through the second shift register unit, and charges the third shift register unit and resets the first shift register unit at the same time.

During the next time period, Gi+5 outputs the high level signal through the third shift register unit, and charges the first shift register unit of the next group (the $(m+1)^{th}$ group) and resets the second shift register unit of the present group at the same time.

Therefore, the present embodiment can realize that the first shift register unit is shared by Gi and Gi+3, the second shift register unit is shared by Gi+1 and Gi+4, and the third shift register unit is shared by Gi+2 and Gi+5, so that the number of the shift register units can be reduce by half and the area occupied by the GOA circuit on the array substrate can be reduced, which satisfies the requirement of narrow frames of the substrate array It is to be noted that three stages of shift register units and six gate lines are cascaded as one group in the present embodiment. If the total number of the gate lines to be driven is not multiples of 6, the remained one to five gate lines can also be cascaded as one group in the manner as described above, and the remaining part in this group can be left empty. That is, the shift register units of the first to third stages and one to five gate lines can be cascaded as an uncompleted group.

Fourth Embodiment

The present embodiment provides an array substrate including a GOA area and a display area, and the GOA circuit provided by the third embodiment is set in the GOA area.

Since the technical feature of the array substrate provided by the present embodiment is the same as that of the GOA circuit provided in the above embodiments, the number of the shift register units can also be reduce by half and the area occupied by the GOA circuit on the array substrate can also be reduced, which satisfies the requirement of narrow frames of the substrate array.

Fifth Embodiment

The present embodiment provides a display device including the array substrate provided in the fourth embodiment. The display device can be any product or part having a function of display, such as liquid crystal panel, electronic paper, OLED panel, television, liquid crystal display, digital camera, mobile phone, tablet computer or the like.

Since the technical feature of the display device provided by the present embodiment is the same as that of the GOA circuit, that is, the array substrate provided in the above embodiments, the number of the shift register units can also be reduce by half and the area occupied by the GOA circuit on the array substrate can also be reduced, which satisfies the requirement of narrow frames of the substrate array The embodiments described above are only the specific implementation of the present disclosure and the protection scope of the present disclosure is not limited thereto. Any change or substitution that is apparent to those skilled in the art without departing from the scope of the present disclosure is within the protection scope of the present disclosure. Therefore, the protection scope of the present disclosure shall be defined by the claims.

The present application claims the priority of the Chinese patent application No. 201310503022.5 filed on Oct. 23, 2013, the entirety of which is incorporated herein by reference.

What is claimed is:

1. An shift register unit, comprising an input module, a charging module, a reset module, a first switch module and a second switch module, wherein a output terminal of the input module is connected to an Ith gate line through the first switch module and connected to a (i+3)th gate line through the second switch module, a control terminal of the first switch module is connected to a first clock signal line and a control terminal of the second switch module is connected to a second clock signal line, and a phase difference between clock signals output from the first clock signal line and the second clock signal line is half of a cycle;

a (i−1)th gate line and a (i+2)th gate line are connected to an input terminal of the input module through the charging module;

a (i+1)th gate line and a (i+4)th gate line are connected to the input terminal and the output terminal of the input module through the reset module;

and i is a natural number and i>2;

wherein the first switch module is a first switch transistor and the control terminal of the first switch module is gate of the first switch transistor;

the second switch module is a second switch transistor and the control terminal of the second switch module is gate of the second switch transistor;

wherein the input module comprises a capacitor and an output switch transistor, two terminals of the capacitor are connected to gate and drain of the output switch transistor, respectively, and source of the output switch transistor is connected to a high level signal line;

the gate of the output switch transistor is the input terminal of the input module and the drain of the output switch transistor is the output terminal of the input module.

2. The shift register unit according to claim 1, wherein the charging module comprises a third switch transistor, the $(i-1)^{th}$ gate line and the $(i+2)^{th}$ gate line are connected to gate and source of the third switch transistor, respectively, and drain of the third switch transistor is connected to the input terminal of the input module.

3. The shift register unit according to claim 2, wherein the $(i-1)^{th}$ gate line is connected to the gate and source of the third switch transistor through a first anti-interference transistor, the $(i-1)^{th}$ gate line is connected to source and gate of the first anti-interference transistor, and the gate and source of the third switch transistor are connected to drain of the first anti-interference transistor;

the $(i+2)^{th}$ gate line is connected to the gate and source of the third switch transistor through a second anti-interference transistor, the $(i+2)^{th}$ gate line is connected to source and gate of the second anti-interference transistor, and the gate and source of the third switch transistor are connected to drain of the second anti-interference transistor.

4. The shift register unit according to claim 1, wherein the reset module comprises a fourth switch transistor and a fifth switch transistor, the $(i+1)^{th}$ gate line and the $(i+4)^{th}$ gate line are connected to gates of the fourth and the fifth switch transistors, respectively, source of the fourth switch transistor is connected to the input terminal of the input module, source of the fifth switch transistor is connected to the output terminal of the input module, and drains of the fourth and the fifth switch transistors are connected to a low level signal line.

5. The shift register unit according to claim 4, wherein the reset module further comprises a sixth switch transistor and a seventh switch transistor, the $(i+1)^{th}$ gate line and the $(i+4)^{th}$ gate line are connected to gates of the sixth and seventh switch transistors, source of the sixth switch transistor is connected to the $i^{th}$ gate line, source of the seventh switch transistor is connected to the $(i+3)^{th}$ gate line, and drains of the sixth and seventh switch transistors are connected to the low level signal line.

6. The shift register unit according to claim 4, wherein the $(i+1)^{th}$ gate line is connected to the gates of the fourth and the fifth switch transistors through a third anti-interference transistor, the (i+1) gate line is connected to source and gate of the third anti-interference transistor, and the gates of the fourth and the fifth switch transistors are connected to drain of the third anti-interference transistor;

the $(i+4)^{th}$ gate line is connected to the gates of the fourth and the fifth switch transistors through a fourth anti-interference transistor, the $(i+4)^{th}$ gate line is connected to source and gate of the fourth anti-interference transistor, and the gates of the fourth and the fifth switch transistors are connected to drain of the fourth anti-interference transistor.

7. A Gate Driver On Array (GOA) circuit comprising n gate lines, six clock signal lines outputting high level pulse signals circularly, and several shift register units, the shift register unit comprising an input module, a charging module, a reset module, a first switch module and a second switch module, wherein a output terminal of the input module is connected to an $j^{th}$ gate line through the first switch module and connected to a $(j+3)^{th}$ gate line through the second switch module, a control terminal of the first switch module is connected to a first clock signal line and a control terminal of the second switch module is connected to a second clock signal line, and a phase difference between clock signals output from the first clock signal line and the second clock signal line is half of a cycle;

a $(j-1)^{th}$ gate line and a $(j+2)^{th}$ gate line are connected to an input terminal of the input module through the charging module;

a $(j+1)^{th}$ gate line and a $(j+4)^{th}$ gate line are connected to the input terminal and the output terminal of the input module through the reset module;

j is a natural number and j≥2, the several shift register units are divided into M groups and each of the groups contains three shift register units, and with respect to the $m^{th}$ group of the shift register units:

the control terminal of the first switch module in a shift register unit of a first stage is connected to a first clock signal line;

the control terminal of the first switch module in a shift register unit of a second stage is connected to a second clock signal line;

the control terminal of the first switch module in a shift register unit of a third stage is connected to a third clock signal line;

the control terminal of the second switch module in the shift register unit of the first stage is connected to a fourth clock signal line;

the control terminal of the second switch module in the shift register unit of the second stage is connected to a fifth clock signal line;

the control terminal of the second switch module in the shift register unit of the third stage is connected to a sixth clock signal line;

the $i^{th}$ gate line is connected to the output terminal of the first switch module in the shift register unit of the first stage and the charging module in the shift register unit of the second stage;

the $(i+1)^{th}$ gate line is connected to the output terminal of the first switch module in the shift register unit of the second stage, the charging module in the shift register unit of the third stage, and the reset module in the shift register unit of the first stage;

the $(i+2)^{th}$ gate line is connected to the output terminal of the first switch module in the shift register unit of the third stage, the charging module in the shift register unit of the first stage, and the reset module in the shift register unit of the second stage;

the $(i+3)^{th}$ gate line is connected to the output terminal of the second switch module in the shift register unit of the first stage, the charging module in the shift register unit of the second stage and the reset module in the shift register unit of the third stage;

the $(i+4)^{th}$ gate line is connected to the output terminal of the second switch module in the shift register unit of the second stage, the charging module in the shift register unit of the third stage, and the reset module in the shift register unit of the first stage;

the (i+5)th gate line is connected to the output terminal of the second switch module in the shift register unit of the third stage and the reset module in the shift register unit of the second stage;

wherein n, i and m are all natural numbers, n=>6, and 1=<6m=<5, and i=6m−5.

8. The GOA circuit according to claim 7, wherein when m>1, the $i^{th}$ gate line is further connected to the reset module in the shift register unit of the third stage in the $(m-1)^{th}$ group of the shift register units; and when m<M, the $(i+5)^{th}$ is further connected to the charging module in the shift register unit of the first stage in the $(m+)^{th}$ group of the shift register units.

9. The GOA circuit according to claim 7, wherein the first switch module is a first switch transistor and the control terminal of the first switch module is gate of the first switch transistor;

the second switch module is a second switch transistor and the control terminal of the second switch module is gate of the second switch transistor.

10. The GOA circuit according to claim 7, wherein the input module comprises a capacitor and an output switch transistor, two terminals of the capacitor are connected to gate and drain of the output switch transistor, respectively, and source of the output switch transistor is connected to a high level signal line;

the gate of the output switch transistor is the input terminal of the input module and the drain of the output switch transistor is the output terminal of the input module.

11. The GOA circuit according to claim 7, wherein the charging module comprises a third switch transistor, the $(j-1)^{th}$ gate line and the $(j+2)^{th}$ gate line are connected to gate and source of the third switch transistor, respectively, and drain of the third switch transistor is connected to the input terminal of the input module.

12. The GOA circuit according to claim 11, wherein the $(j-1)^{th}$ gate line is connected to the gate and source of the third switch transistor through a first anti-interference transistor, the $(j-1)^{th}$ gate line is connected to source and gate of the first anti-interference transistor, and the gate and source of the third switch transistor are connected to drain of the first anti-interference transistor;

the $(j+2)^{th}$ gate line is connected to the gate and source of the third switch transistor through a second anti-interference transistor, the $(j+2)^{th}$ gate line is connected to source and gate of the second anti-interference transistor, and the gate and source of the third switch transistor are connected to drain of the second anti-interference transistor.

13. The GOA circuit according to claim 7, wherein the reset module comprises a fourth switch transistor and a fifth switch transistor, the $(j+1)^{th}$ gate line and the $(j+4)^{th}$ gate line are connected to gates of the fourth and the fifth switch transistors, respectively, source of the fourth switch transistor is connected to the input terminal of the input module, source of the fifth switch transistor is connected to the output terminal of the input module, and drains of the fourth and the fifth switch transistors are connected to a low level signal line.

14. The GOA circuit according to claim 13, wherein the reset module further comprises a sixth switch transistor and a seventh switch transistor, the $(j+1)^{th}$ gate line and the $(j+4)^{th}$ gate line are connected to gates of the sixth and seventh switch transistors, source of the sixth switch transistor is connected to the $i^{th}$ gate line, source of the seventh switch transistor is connected to the $(j+3)^{th}$ gate line, and drains of the sixth and seventh switch transistors are connected to the low level signal line.

15. The GOA circuit according to claim 13, wherein the $(j+1)^{th}$ gate line is connected to the gates of the fourth and the fifth switch transistors through a third anti-interference transistor, the $(j+1)^{th}$ gate line is connected to source and gate of the third anti-interference transistor, and the gates of the fourth and the fifth switch transistors are connected to drain of the third anti-interference transistor;

the $(j+4)^{th}$ gate line is connected to the gates of the fourth and the fifth switch transistors through a fourth anti-interference transistor, the $(j+4)^{th}$ gate line is connected to source and gate of the fourth anti-interference transistor, and the gates of the fourth and the fifth switch transistors are connected to drain of the fourth anti-interference transistor.

16. A display device comprising an array substrate, the array substrate having a Gate Driver On Array (GOA) area with a GOA circuit being set therein and a display area, the GOA circuit comprising n gate lines, six clock signal lines outputting high level pulse signals circularly, and several shift register units, the shift register unit comprising an input module, a charging module, a reset module, a first switch module and a second switch module, wherein a output terminal of the input module is connected to an $j^{th}$ gate line through the first switch module and connected to a $(j+3)^{th}$ gate line through the second switch module, a control terminal of the first switch module is connected to a first clock signal line and a control terminal of the second switch module is connected to a second clock signal line, and a phase difference between clock signals output from the first clock signal line and the second clock signal line is half of a cycle;

a $(j-1)^{th}$ gate line and a $(j+2)^{th}$ gate line are connected to an input terminal of the input module through the charging module;

a $(j+1)^{th}$ gate line and a $(j+4)^{th}$ gate line are connected to the input terminal and the output terminal of the input module through the reset module;

j is a natural number and j≥2, the several shift register units are divided into M groups and each of the groups contains three shift register units, and with respect to the $m^{th}$ group of the shift register units:

the control terminal of the first switch module in a shift register unit of a first stage is connected to a first clock signal line;

the control terminal of the first switch module in a shift register unit of a second stage is connected to a second clock signal line;

the control terminal of the first switch module in a shift register unit of a third stage is connected to a third clock signal line;

the control terminal of the second switch module in the shift register unit of the first stage is connected to a fourth clock signal line;

the control terminal of the second switch module in the shift register unit of the second stage is connected to a fifth clock signal line;

the control terminal of the second switch module in the shift register unit of the third stage is connected to a sixth clock signal line;

the $i^{th}$ gate line is connected to the output terminal of the first switch module in the shift register unit of the first stage and the charging module in the shift register unit of the second stage;

the $(i+1)^{th}$ gate line is connected to the output terminal of the first switch module in the shift register unit of the second stage, the charging module in the shift register unit of the third stage, and the reset module in the shift register unit of the first stage;

the $(i+2)^{th}$ gate line is connected to the output terminal of the first switch module in the shift register unit of the third stage, the charging module in the shift register unit of the first stage, and the reset module in the shift register unit of the second stage;

the $(i+3)^{th}$ gate line is connected to the output terminal of the second switch module in the shift register unit of the first stage, the charging module in the shift register unit of the second stage and the reset module in the shift register unit of the third stage;

the $(i+4)^{th}$ gate line is connected to the output terminal of the second switch module in the shift register unit of the second stage, the charging module in the shift register unit of the third stage, and the reset module in the shift register unit of the first stage;

the (i+5)th gate line is connected to the output terminal of the second switch module in the shift register unit of the third stage and the reset module in the shift register unit of the second stage;

wherein n, i and m are all natural numbers, n=>6, and 1=<6m=<5, and i=6m−5.

* * * * *